United States Patent [19]

Berry et al.

[11] Patent Number: 4,875,022

[45] Date of Patent: Oct. 17, 1989

[54] HIGH POWER MICROWAVE EXPANDER FOR PRODUCING FAST RISE TIME PULSES

[75] Inventors: Mark D. Berry, Columbia; Robert J. Tan, Beltsville; Robert V. Garver, Boyds, all of Md.

[73] Assignee: The United States of America as represented by the Secretary of the Army, Washington, D.C.

[21] Appl. No.: 174,283

[22] Filed: Mar. 28, 1988

[51] Int. Cl.⁴ .................. H03K 5/04; H03K 3/537
[52] U.S. Cl. ................................... 333/20; 328/65
[58] Field of Search .................. 333/20, 13, 17 L; 328/65, 67; 307/106

[56] References Cited

U.S. PATENT DOCUMENTS

| | | | |
|---|---|---|---|
| 2,760,163 | 8/1956 | Arditi | 333/13 |
| 2,798,186 | 7/1957 | Cartheness | 333/13 |
| 3,281,719 | 10/1966 | Goldberg | 333/101 |
| 3,360,678 | 12/1967 | Kerns | 328/65 X |
| 3,484,619 | 12/1969 | Proud, Jr. | 333/20 |
| 4,003,007 | 1/1977 | Stewart | 333/20 |
| 4,719,429 | 1/1988 | Ikezi et al. | 328/65 |

OTHER PUBLICATIONS

Tan et al., "High-Power, Short-Pulse Forming Circuits," IEEE MTT-S International Microwave Symposium Digest, vol. 1, Jun. 9-11, 1987, pp. 399-402.
Smith, III et al., "Gas Break Down Transmit-Receive Tube Turn-On Times," IEEE Transaction on Plasma Science, vol. PS-14, No. 1, Feb. 1986, pp. 63-66.

Primary Examiner—Eugene R. LaRoche
Assistant Examiner—Benny Lee
Attorney, Agent, or Firm—Saul Elbaum; Guy Miller

[57] ABSTRACT

An high power microwave expander is provided which decreases the rise time of rf pulses. The expander is a transmission line in which internal conductors are separated and tapered to provide a spark gap with high isolation characteristics at low power. The arcing threshold of the spark gap can be adjusted by varying the internal pressure of the transmission line, injecting a gas such as helium into the transmission line and by providing free electrons in close proximity to the spark gap.

28 Claims, 7 Drawing Sheets

TOWNSEND DISCHARGE AND PASCHEN'S LAW

FIG. 7

FIG. 8b — RISE-TIME OF MAGNETRON PULSE

FIG. 8a — 7 KW PULSE AT 10ns RISE-TIME AND 28ns PULSE WIDTH

INPUT PULSE
8KW
200 ns/DIV.
0.25µs RISE TIME
FIG.13b

OUTPUT PULSE
8KW
ins/div
2ns RISE TIME
FIG.13a

HIGH POWER MICROWAVE EXPANDER FOR PRODUCING FAST RISE TIME PULSES

RIGHTS OF THE GOVERNMENT

The invention described herein may be manufactured, used and licensed by or for the U.S. Government for Governmental purposes without payment to us of any royalty thereon.

BACKGROUND OF THE INVENTION

1. Field of the Invention

The present invention relates to fast-rise-time, short duration microwave signal devices and more particularly to an arc-activated, passive, in-line, microwave expander for generating fast-rise-time pulses from magnetron pulses.

2. Description of the Prior Art

Fast-rise-time, high power microwave (HPM) pulses from high performance radars may be able to pass through electronic protection devices such as diode limiters before these devices turn on, thereby potentially damaging receiver front ends. The pulse leaking past a protection device may be quite short in duration and significantly high in power (10 to 100 kW). Devices like PIN diode limiters, terminal protection devices and other similar systems react differently when subjected to these fast rising pulses. Studying the spike leakage and damage threshold of these devices is necessary so that systems can be optimally protected. Consequently, there is a great need to test these electronic systems with fast-rise-time, HPM pulses in order to understand and improve their immunity.

Present devices for producing fast-rise-time, high power microwave pulses include diode switches, laser-switched semiconductors, switched waveguide cavities, and transmit-receive tubes. However, these devices have proved cumbersome and impractical. For example, a diode switch can only operate at low power levels, therefore it must be followed by expensive traveling-wave tube (TWT) amplifiers to obtain the high power levels required for testing. In contrast, a laser-switched semiconductor, which works on the principle of changing the impedance of the semiconductor using laser light, can operate in the megawatt region but requires a large and expensive laser system which must be brought into the same location as the large and expensive high power source. A switched waveguide cavity is undesirable because it requires a microwave source with high spectral purity which is much more expensive than a conventional magnetron. Lastly, although the reflected pulse used from a TR tube gives a fast rise time at high power levels, it is limited because TR tubes are narrow band devices, made only in waveguide, and work only at limited specified power levels. TR tubes also require a circulator or directional couplers, adding to the cost.

It may be appreciated that there is a great need for an easy to use device that produces a fast-rise-time, HPM pulses for testing purposes.

SUMMARY OF THE INVENTION

It is therefore a primary object of this invention to provide an arc-activated device that produces a fast-rise-time HPM pulse, using conventional slow-rise-time magnetrons, that is easy to use and inexpensive.

Another object of the invention is to provide an arc-activated device that produces a fast-rise-time HPM pulse that is small, passive and in-line.

A still further object of the invention is to provide a small, passive, in-line, arc-activated device that produces a fast-rise-time HPM pulse, using conventional magnetrons, that is adjustable or tuned for different frequencies and output power.

The foregoing and other objects are attained in accordance with one aspect of the invention through the use of an arc-activated expander that comprises a coaxial transmission line in which center conductors are separated from one another forming a spark gap. The ends of the conductors are tapered to form substantially conical tips. Means are provided for adjusting the internal gas pressure of the transmission line and for injecting gases into the transmission line so that the arcing threshold of the spark gap can be adjusted. Means are also provided for introducing "seed" electrons into the spark gap in order to facilitate arcing of the spark gap. This coaxial expander provides a simple, in-line device that produces fast-rise-time pulses from magnetron pulses.

In accordance with another aspect of the invention an arc-activated expander is realized in waveguide which includes opposing coaxial transmission lines terminating in a spark gap and representing lambda/4, where lambda is the wavelength generated by the magnetron.

In accordance with still another aspect of the invention, an arc-activated expander comprises a stripline in which a spark gap terminal protection device is used as a switch.

Other and important objects will be apparent to those skilled in this art from the following description when considered with the appended drawings.

DESCRIPTION OF THE PREFERRED EMBODIMENTS

Referring now to the drawings, like reference numerals represent identical or corresponding parts throughout the several views.

Figure 1:
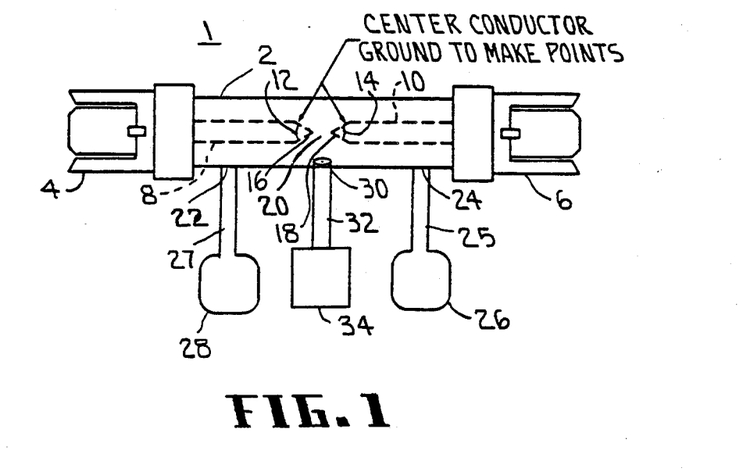
FIG. 1 shows a coaxial expander according to an embodiment of the invention.

FIG. 1 shows a coaxial expander 1 built using a General Radio 10 cm coaxial air line 2 and standard rf connectors 4 and 6. The connectors 4 and 6 were removed and the center conductor cut in half creating center conductors 8 and 10. The ends of the center conductors 8 and 10, are formed into substantially conical tips 16 and 18 respectively. They can be formed by shaving, sharpening, etc. but do not have to be formed into perfectly smooth cones to operate. Alternatively, other shapes may be employed. The tips 16 and 18 have apex angles 12 and 14 and are separated from one another creating a spark gap 20. The spark gap's width ranges from 0.01-1.10 inches. The coaxial air line 2 has a first orifice 22 for gas intake and a second orifice 24 for gas exhaust. Orifice 24 is connected to a vacuum pump 26 through a gas line 25. Orifice 22 is connected to a gas supply 28 through a gas line 27. The coaxial air line 2 has a third orifice 30, placed in close proximity to the spark gap 20, through which one end of a coaxial transmission line 32 is placed. The other end of the coaxial transmission line 32 is connected to a dc power source 34.

Figure 2:
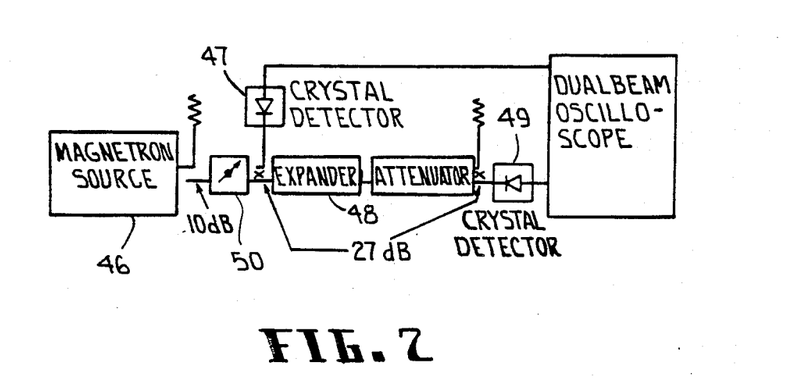
FIG. 2 is a circuit block diagram of a test setup for testing expanders of the present invention.

The coaxial expander 1 of FIG. 1 was tested in the arrangement shown in FIG. 2 where the input and output power were measured with crystal detectors 47 and 49. The coaxial expander 1 had a spark gap 20 of about 0.1 inch and was first tested without the use of a vacuum 26, gas supply 28 or dc power source 34.

Figure 3:
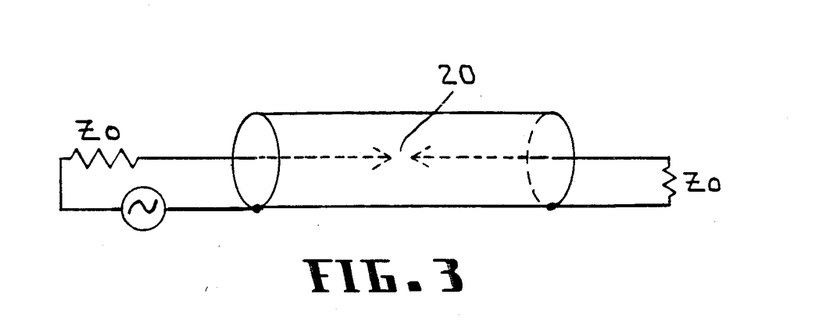
FIG. 3 shows a schematic of the coaxial expander of FIG. 1.
Figure 4:
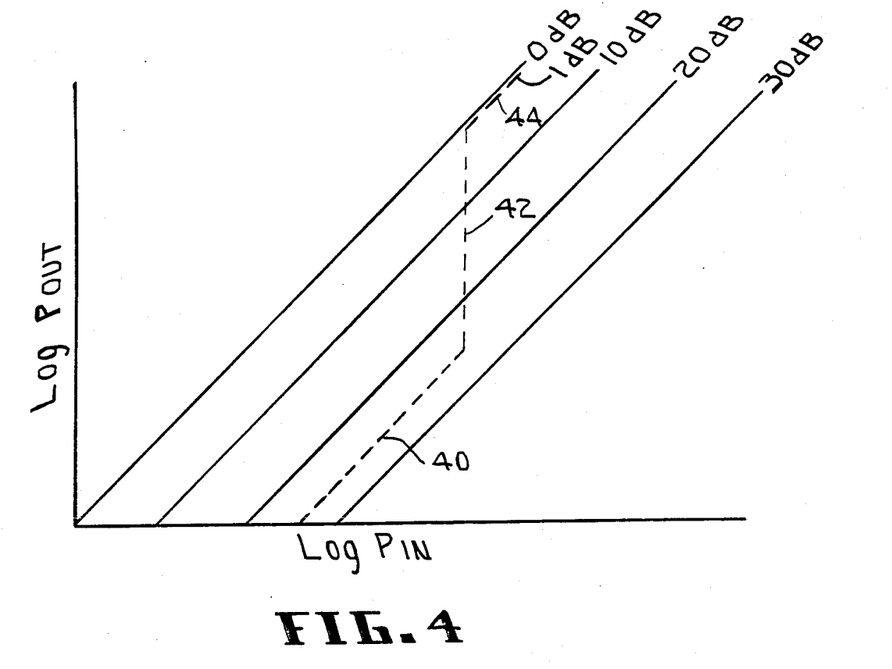
FIG. 4 is a chart showing log power out versus log power in of the coaxial expander of FIG. 1.

Referring now to FIG. 2 a pulse with a power level of about 1 MW is generated by a magnetron 46 and 100 KW of which is delivered to the expander 48 through attenuator 50. The expander to be tested 48 is connected in series with the output of the magnetron 46 to provide fast-rise pulses in the 50-100 KW range. The coaxial expander 1 of FIG. 1 operates basically in S-band but can be used from dc to 5 GHz. It is wide band since it is built in a coaxial structure. The equivalent circuit of the coaxial expander 1 is shown in FIG. 3. The spark gap 20 looks like a low value capacitor at low power and a low value resistor at high power. FIG. 4 shows what happens to the coaxial expander's isolation during a high power pulse.

As shown in FIG. 4, during the slow rise of a high power pulse, the coaxial expander 1 has an isolation of about 25 db, designated by the dashed line portion 40, due to the low capacitance (on the order of 0.03 pf) of the tips. The series capacitance is a high impedance in series with the center conductors of the coaxial expander. A high series impedance blocks incident rf causing it to be reflected back to the magnetron 46 and provides the high (25 dB) isolation. As the power of the pulse from the magnetron 46 increases, the arching threshold is reached and an arc forms across the spark gap 20 and the attenuation rapidly goes to about 1 dB, designated by the dashed line portion 42. The arc continues during the entire pulse so the attenuation (insertion loss now) stays at 1 dB, designated by the dashed line portion 44.

Figure 5:
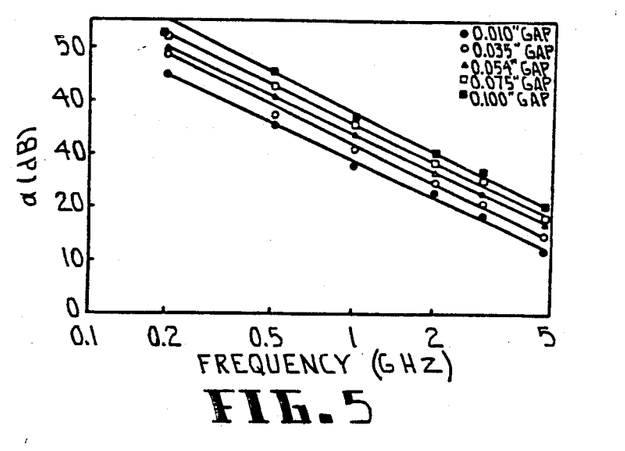
FIG. 5 is a chart showing attenuation versus frequency of various spark gap widths for the coaxial expander of FIG. 1.

The arc across the spark gap 20 builds up very fast giving a rise-time of 1 to 10 ns. Because the build up of the arc is a nonlinear process the change in conductivity is rapid when R is large and slower when R is small. Therefore, when the arc occurs in a low impedance configuration such as in series in a 50 ohm coax, the rise-time is slightly slower (2-10 ns). When it occurs in a high impedance environment, such as the high E-field of a resonant cavity or high impedance waveguide, the rise-time is much faster (1-2 ns). Consequently, the capacitance of the spark gap 20 must be made low so that the isolation will be high at low power. The capacitance of the gap can be found by measuring the isolation it provides. An example of the isolation versus frequency for different gaps using the same apex angle for the tips 16 and 18 is shown in FIG. 5. Capacitance may then be calculated using equation (1):

$$\eta = 20 \log \frac{1}{2 wCZ_o} \quad (1)$$

where $\eta$ is isolation in decibels, $Z_o$ is the characteristic impedance of a transmassion line, C is capacitance in farads, and w is angular frequency.

There are two parameters that affect the capacitance of the spark gap 20 in the coaxial expander 1 of FIG. 1. The width of the spark gap 20 and the taper, or apex angles 12 and 14, of the tips 16 and 18. The capacitance of the spark gap can be lowered by widening the gap and by sharpening or tapering of the tips creating smaller apex angles.

Figure 6:
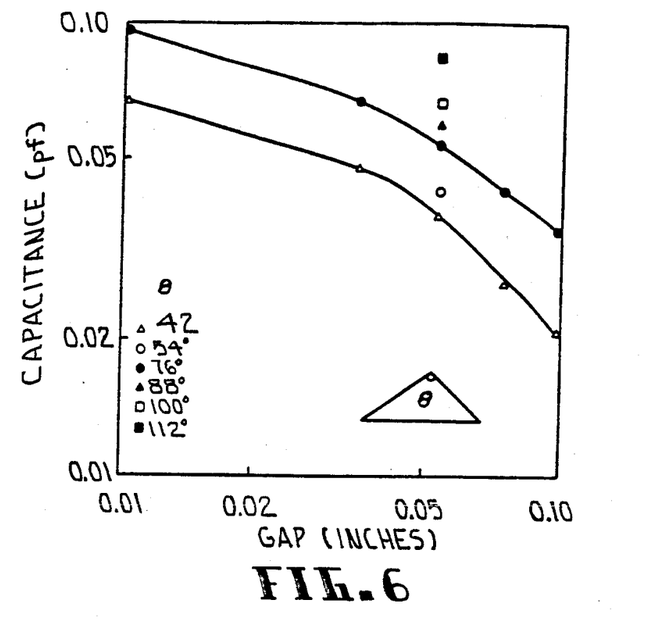
FIG. 6 is a chart showing capacitance versus spark gap width of various apex angles for the conductors of the coaxial expander of FIG. 1.

FIG. 6 shows the capacitance of the spark gap 20 as a function of different gap widths and various apex angles ($\theta$). As can be seen, lower capacitances will be realized using smaller apex angles and wider gaps. However, there is a point at which the spark gap 20 will no longer arc or will become very intermittent, given a fixed input power level, due to a prohibitively high arcing threshold. Consequently, the parameters must be balanced to allow for ease of arcing as well as provide high isolation at low power.

Figure 7:
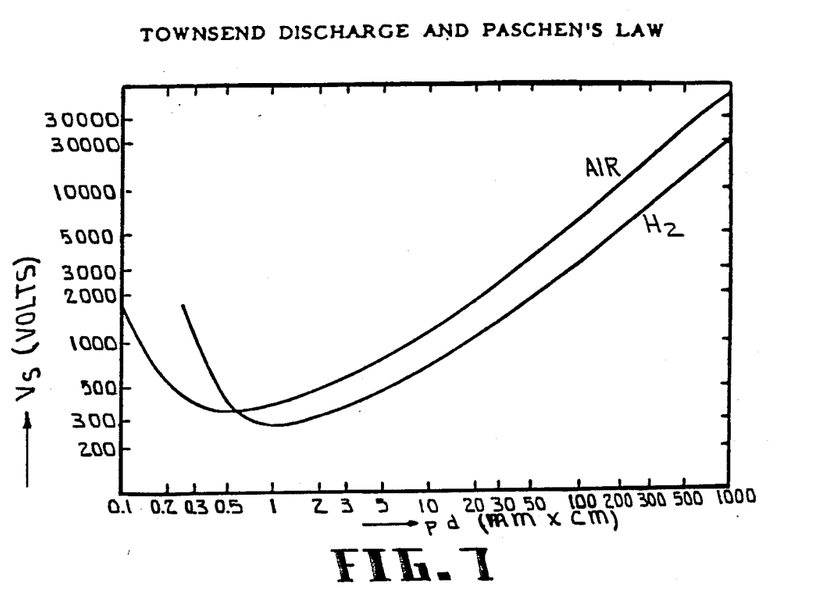
FIG. 7 is a chart showing curves for Townsend Discharge and Paschen's Law.

Another parameter that affects the performance and arcing threshold of the coaxial expander 1 is the internal pressure of the coaxial expander. Given a set spark gap width and tip apex angle the arcing threshold of the coaxial expander 1 can be lowered by decreasing the internal pressure of the coaxial expander 1. A vacuum 26 was connected to orifice 24 through gas line 25. This arrangement provides a means for adjusting the internal pressure of the coaxial expander 1. The Paschen curve, shown in FIG. 7, was used to find a pressure where the arcing threshold woud be lowest. The coaxial expander 1 was evacuated to pressures as low as 3 torr (mm of Mercury). Decreasing the internal pressure of the coaxial expander 1 results in a way to adjust the arcing threshold as well as provide for a more reliable device.

Still another parameter that affects the performance of the coaxial expander 1 is the presence of a gas, such as helium. A gas supply 28 is connected to orifice 22 through gas line 27. This arrangement provides a means for injecting gases into the coaxial expander 1. By injecting a gas such as helium into the coaxial expander 1, arcing is made more consistent and the arcing threshold can be adjusted lower.

Another way in which to promote arcing is to provide "seed" electrons in the vicinity of the spark gap 20. A semiridgid coaxial transmission line 32 has one end inserted into orifice 30, which is in close proximity to the spark gap 20, and its other end connected to a dc power supply 34. This arrangement provides a means for supplying seed electrons. By setting the dc power supply 34 at several hundred volts, the semiridgid coaxial transmission line 32 would give a glow gas discharge illuminating the spark gap 20 with ultraviolet light. Providing electrons to the spark gap 20 in this fashion promotes arcing.

Figure 8A:
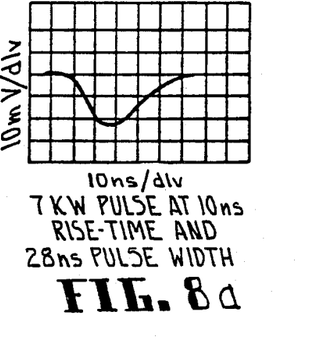
FIGS. 8A and 8B show input and output pulses respectively of the coaxial expander of FIG. 1.
Figure 8B:
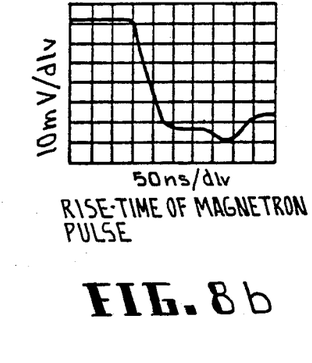

An output pulse resulting from a coaxial expander 1 that has been evacuated, injected with helium, and introduced with seed electrons is shown in FIG. 8A. The input rf pulse delivered to the coaxial expander 1 is shown in FIG. 8B. As can be seen from FIG. 8A, the rise-time of the pulse generated by the coaxial expander 1 is on the order of 3–10 ns whereas the input rf pulse delivered by the magnetron, as shown in FIG. 8B, is on the order of 50–100 ns. However, the output pulse width is very short. This is caused by the connectors 4 and 6 of the coaxial expander 1 arcing in shunt, shorting out the rest of the pulse. To overcome this problem the connectors 4 and 6 are removed from the lower pressure environment. By sealing off the vacuum to just the spark gap 20 section, the arcing to the connectors 4 and 6 is eliminated resulting in the expander passing the entire pulse.

The coaxial expander 1 exhibited superior results with a spark gap width of 0.06 inch, tips with apex angles of 35°, an evacuated pressure of 20 Torr in helium and with the semiridgid coaxial transmission line charged for providing seed electrons.

Figure 9:
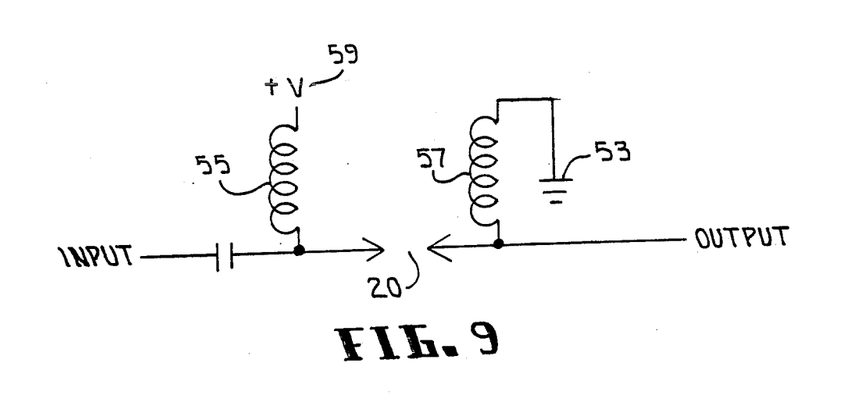
FIG. 9 shows a schematic of the coaxial expander of FIG. 1 with bias tees.

A still further way in which the arcing threshold of the coaxial expander 1 can be adjusted is though the use of bias tees or inductors 55 and 57 as shown in FIG. 9. Biasing the spark gap 20 directly will help in lowering the arcing threshold and the consistency of the output. The voltage 59 may be adjusted to obtain different arcing thresholds or rise times. The ground return 53 must be very close to the spark gap to lower the inductance. With the use of the bias tees 55 and 57 as shown in FIG. 9, the spark gap 20 can also be externally triggered with a fast-rise-time dc pulse. This pulse would be synchronized with the rf pulse from the magnetron. The dc pulse would lower the arcing threshold so that the rf pulse would trigger the arc.

Figure 10:
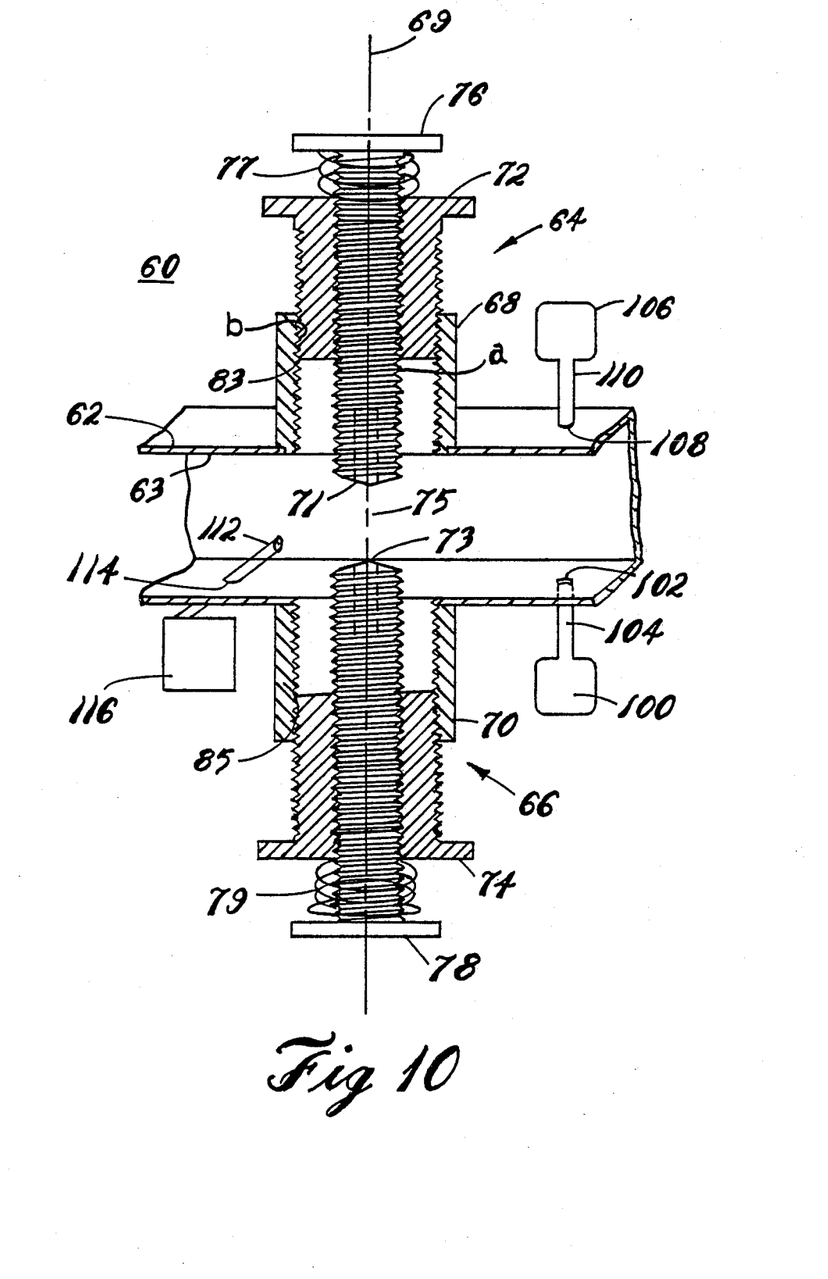
FIG. 10 shows a waveguide expander according to another embodiment of the present invention.

FIG. 10 shows a second embodiment of the present invention. A waveguide expander 60 comprises a waveguide 62 (an X-band waveguide was used) with a parallel coaxial transmission line structure formed by coaxial screw mechanisms 64 and 66. Screw mechanisms 64 and 66 are comprised of cylindrical outside conductors 68 and 70 that are in electrical contact with the waveguide 62, metal adjustment members 72 and 74, and center conductor screws 76 and 78. The coaxial transmission line formed by screw mechanisms 64 and 66 terminate at a spark gap 75. The center conductor screws 76 and 78 are diametrically opposed to one another and are connected to the waveguide so that the screws 76 and 78 extend along the electrical field lines generated in the waveguide. The waveguide expander 60 was fabricated using standard machine screws with tungsten tips 71 and 73 to withstand repeated arcing. Other tip materials may be used. While tungsten provides extended use because of its high melting point, nickel may be used for its high thermal conductivity.

Figure 11:
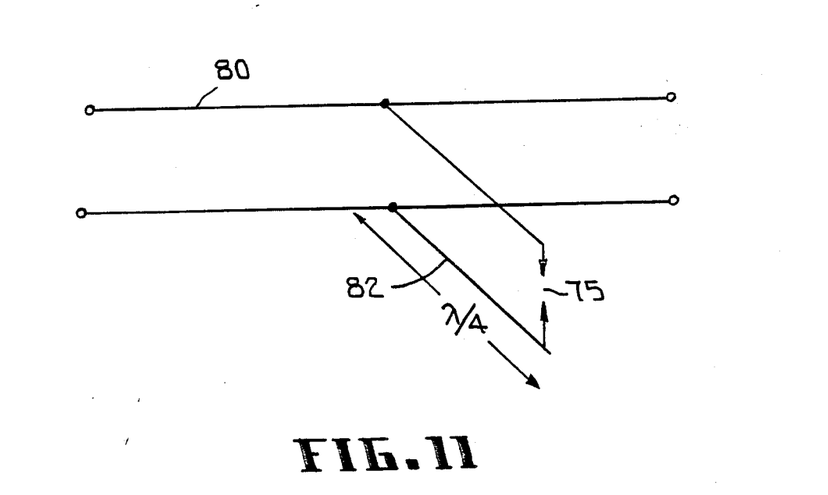
FIG. 11 shows a schematic of the waveguide expander of FIG. 10.

FIG. 11 shows the equivalent circuit of FIG. 10. The equivalent circuit shows a transmission line 80 that has a parallel stub 82 that is terminated in a spark gap 75. The spark gap 75 is positioned so that it appears to an input pulse that it is one quarter wavelength away from the transmission line 80.

Figure 12:
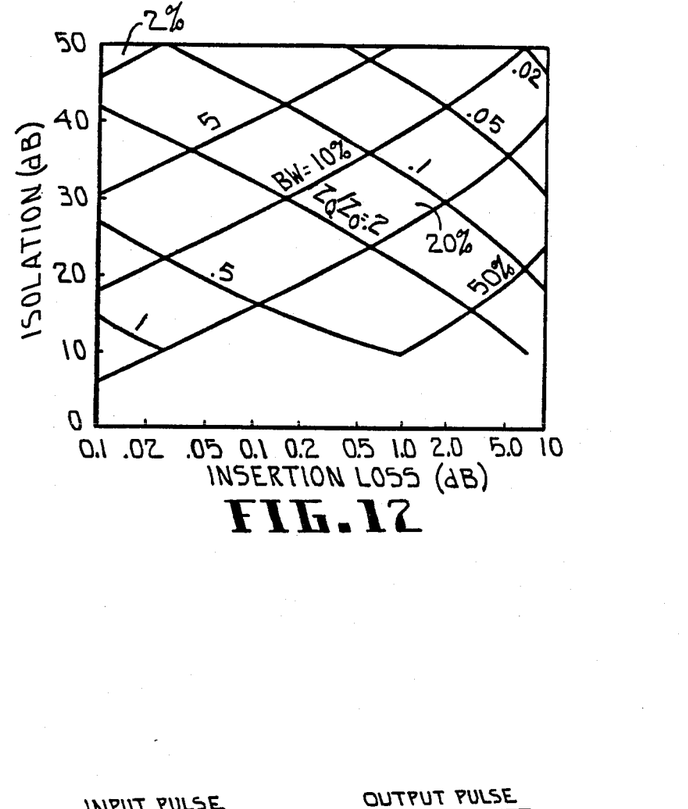
FIG. 12 is a graph showing insertion loss versus isolation for an X-band expander.

Insertion loss and isolation were calculated using equations (2) and (3):

$$\eta = 20 \log \frac{B}{2Y_o} = 20 \log \left[ \frac{Y_Q}{2Y_o} \tan(90 - 0.45\ BW) \right] \quad (2)$$

$$\delta = 10 \log \left[ 1 + \left( \frac{B}{2Y_o} \right)^2 \right] = \quad (3)$$

$$20 \log \left[ 1 + \left( \frac{Y_Q}{2Y_o} \cot(90 - 0.45\ BW) \right)^2 \right]$$

where $\eta$ is the isolation in decibels (db), $\delta$ is insertion loss in db, $Y_o$ is characteristic admittance of the waveguide in mhos, $Y_Q$ is the admittance of the $\lambda/4$ transformer (stub) in mhos, B is the susceptance in mhos, and BW is the bandwidth in percent. Equation (3) represents the insertion loss during the high power state (during arcing) and are plotted in FIG. 12. The dimensions of the coaxial transmission line structure were determined using FIG. 12 and equation (4):

$$Z_o = 60 \ln \left( \frac{b}{a} \right) \quad (4)$$

where b is the internal radius of the outer conductors 68 and 70 measured from center line 69 and a is the radius of the inner conductors 76 and 78 measured from center line 69 as shown in FIG. 10. For 40 dB isolation, 7 percent BW, and about 0.25 dB insertion loss, $Z_Q/Z_o = 0.1$ is taken from FIG. 12. Therefore, with $Z_o = 400$ ohms for X-band waveguide, the impedance $Z_Q$ of the coaxial structure must be 40 ohms.

The waveguide expander 60 was tested in the arrangement as shown in FIG. 2 where the input and output power were measured with crystal detectors 47 and 49. A high power pulse is delivered by the magnetron 46. Referring now to FIG. 11, at low power, there is an open at the spark gap 75 which transforms to a short across the transmission line 80 resulting in all the power being reflected. At high power, there is a short across the spark gap 75 which transforms to an open at the transmission line 80.

Figure 13A:
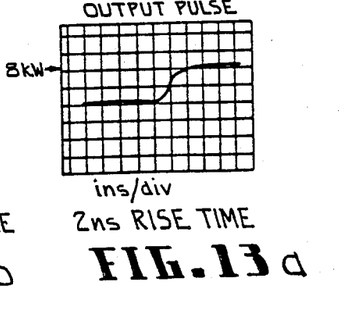
FIGS. 13A and 13B show input and output pulses respectively of the waveguide expander of FIG. 10.
Figure 13B:
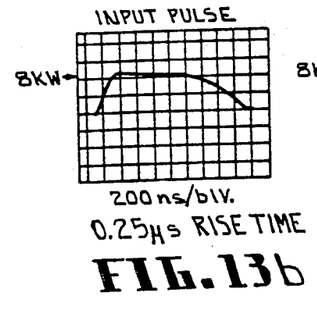

An output pulse resulting from a waveguide expander 60 that was tested in the arrangement as shown in FIG. 2 is shown in FIG. 13A. The input rf pulse delivered to the waveguide expander 60 is shown in FIG. 13B. As can be seen from FIG. 13A, the rise-time of the pulse generated by the microwave expander 60 is on the order of 1–2 ns whereas the input rf pulse delivered by the magnetron, as shown in FIG. 13B, is on the order of 100–200 ns.

While, theoretically, the spark gap 75 is positioned so that it appears to an input pulse that it is one quarter wavelength away from the waveguide 62, the configuration of the screw mechanisms 64 and 66 in FIG. 10 that gave the best results is as follows. The waveguide 62 measured from top wall 63 to bottom wall 65 has a dimension of 0.400''. The distance from the bottom 83 of metal adjustment member 72 to the top wall 63 of waveguide 62 is 0.240''. The distance center conductor screw 76 extends from the bottom 83 of metal adjustment member 72 to its tip 71 is 0.880''. The distance from the bottom 85 of metal adjustment member 74 to the bottom wall 65 of waveguide 62 is 0.315". The distance center conductor screw 78 extends from the bottom 85 of metal adjustment member 74 to its tip 73 is 0.040". These dimensions result in a spark gap 75 having a separation of 0.035".

To improve the repeatability of the output pulse generated by the waveguide expander 60 of FIG. 10 springs 77 and 79 are placed between screws 76 and 78 and adjustment members 72 and 74 to increase the tension of the threads. Tungsten points 71 and 73 help eliminate point erosion.

Additionally, as previously described for FIG. 10 a vacuum 100 may be connected to orifice 102 through gas line 104, a gas supply 106 may be connected to orifice 108 through gas line 110, and a semiridgid coaxial transmission line 112 has one end inserted into orifice 114 which is in close proximity to the spark gap 75 while its other end is connected to a dc power supply 116. While the semiridgid coaxial transmission line 112 is shown inserted at an angle into the waveguide expander 60 it could easily be positioned as the one shown in FIG. 1

Figure 14:
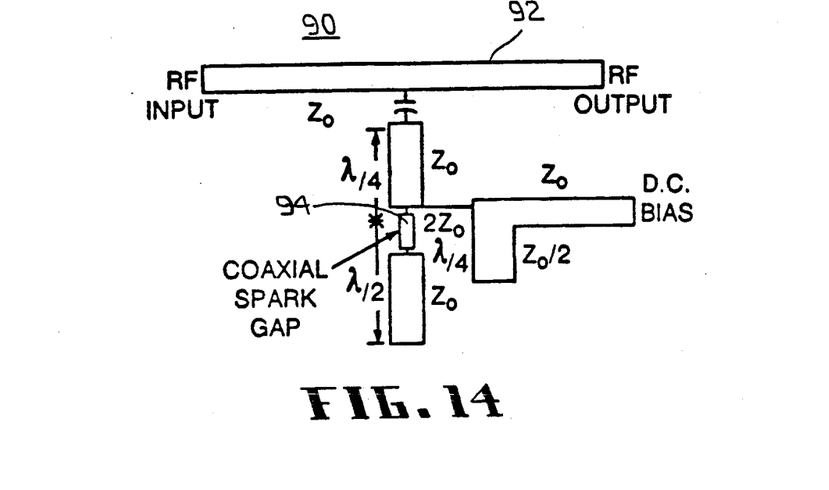
FIG. 14 shows a stripline expander according to another embodiment of the present invention.

Another embodiment of the present invention is shown in FIG. 14. An S-Band stripline expander 90 comprises a main transmission line 92 and a spark gap terminal protection device 94 used as a switch. The terminal protection device TPD is a type 72/200 coaxial surge arrester manufactured by M-O Valve Company. The TPD arcs in shunt at 150 to 200 Volts dc and provides low insertion loss at low power levels, for frequencies up to 5 GHz.

The stripline expander 90, shown in FIG. 14, was designed to operate at 2.74 GHz. When the coaxial spark gap 94 is conducting (at high power) it is a short circuit which is transformed to an open circuit across the main transmission line 92, thus providing low loss. At low power it is a through device (low insertion loss) and the open circuit $\lambda/2$ away appears at the TPD. This is transformed by the $\lambda/4$ to a short across the main transmission line, which reflects incident power. The insertion loss at 2.74 GHz with the TPD shorted to ground was 0.1 dB and the isolation with the TPD open circuited was 18 dB. In order to drive the TPD to a low impedance it is turned on with a 1000 volt fast-rise-time video pulse, (i.e., less than 1 ns rise time), generated by a charged line and reed switch. When the TPD is arcing with this voltage pulse, it appears as a 1-2 ohm resistor to ground.

Figure 15:
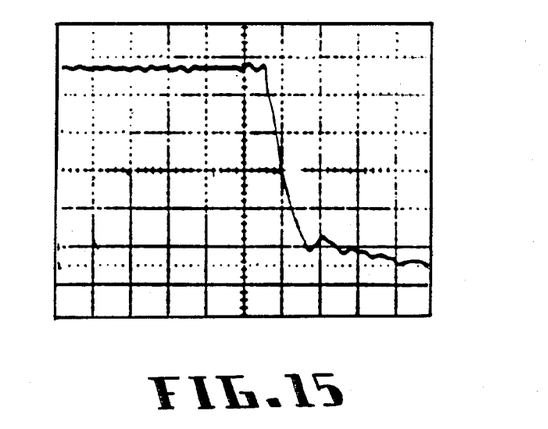
FIG. 15 shows an output pulse of the stripline expander of FIG. 14.

The stripline expander 90 was tested with a 10 W continuous wave input. The resulting rf output is the 10 W step with a rise time of 2 ns as shown in FIG. 15.

The invention is obviously not limited to the embodiments described above by way of examples. It is susceptible of numerous variants and, in particular may be employed in other transmission lines at frequencies not associated with the current embodiments.

What is claimed is:

1. An apparatus for producing high power microwave pulses that have extremely fast rise times compared to rise times of a signal delivered from a microwave signal source comprising:

an air coaxial transmission line having input and output ends and a predetermined internal pressure, said coaxial transmission line having a spark gap ranging from about 0.01–0.10 inch positioned between said input and output ends;

means for adjusting the internal pressure of said coaxial transmission line so that the arcing threshold of said spark gap can be varied;

means for coupling said microwave signal source to said input end of said coaxial transmission line; and means for coupling a load to said output end of said coaxial transmission line; whereby said microwave signal source delivers an input pulse, having a rise time, via said input end of said transmission line to the spark gap, the spark gap presenting a high impedance during the initial rise of the input pulse until the power of the input pulse reaches an arcing threshold of said spark gap causing said spark gap to arc, resulting in an output pulse delivered to said load that has a rise time that is faster than the rise time of the input pulse.

2. The apparatus of claim 1 wherein the internal pressure of said coaxial transmission line is adjusted to 20 Torr.

3. An apparatus for producing high power microwave pulses that have extremely fast rise times compared to rise times of a signal delivered from a microwave signal source comprising:

an air coaxial transmission line having input and output ends, said coaxial transmission line having a spark gap ranging from about 0.01–0.10 inch positioned between said input and output ends;

a first center conductor in said coaxial transmission line having a first end tapered to form a substantially conical tip having an apex angle ranging from about 10°–112° and a second end;

a second center conductor in said coaxial transmission line having a first end tapered to form a substantially conical tip having an apex angle ranging from about 10°–112° and a second end, the first end of said first center conductor separated from the first end of said second center conductor creating said spark gap;

means for coupling said microwave signal source to said input end of said coaxial transmission line; and means for coupling a load to said output end of said coaxial transmission line; whereby said microwave signal source delivers an input pulse, having a rise time, via said input end of said coaxial transmission line to the spark gap, the spark gap presenting a high impedance during the initial rise of the input pulse until the power of the input pulse reaches an arcing threshold of said spark gap causing said spark gap to arc, resulting in an output pulse delivered to said load that has a rise time that is faster than the rise time of the input pulse.

4. The apparatus of claim 3 wherein the spark gap is about 0.06 inch.

5. The apparatus of claim 3 wherein the apex angle is about 35°.

6. The apparatus of claim 3 further comprising:
    means for injecting a gas into said coaxial transmission line for promoting arcing of said spark gap.

7. The apparatus of claim 6 wherein said gas is comprised of helium.

8. The apparatus of claim 3 further comprising:
    means for providing a bias voltage across the spark gap so that the arcing threshold of the spark gap can be varied.

9. The apparatus of claim 3 further comprising:
    means for introducing electrons into said spark gap so that consistent arcing of said spark gap is achieved when the arcing threshold is reached.

10. An apparatus for producing high power microwave pulses that have extremely fast rise times compared to rise times of a signal delivered from a microwave signal source comprising;
- a stripline transmission line having input and output ends, said stripline transmission line tuned to the signal delivered from said microwave signal source having a wavelength lambda;
- means for coupling said microwave signal source to said input end of said stripline transmission line;
- means for coupling a load to said output end of said stripline transmission line;
- a branch stripline having a one quarter lambda length portion connected in shunt to said stripline transmission line and a one half lambda length portion with a spark gap formed between opposing ends of the portions; and
- means for providing a bias voltage across the spark gap.

11. An apparatus for producing high power microwave pulses that have extremely fast rise times compared to rise times of a signal delivered from a microwave signal source comprising:
- a rectangular waveguide transmission line having input and output ends and a predetermined internal pressure, said waveguide transmission line having a spark gap ranging from about 0.01–0.10 inch positioned between said input and output ends;
- means for coupling said microwave signal source to said input end of said waveguide transmission line; and
- means for coupling a load to said output end of said waveguide transmission line; whereby
- said microwave signal source delivers an input pulse, having a rise time, via said input end of said waveguide transmission line to the spark gap, the spark gap presenting a high impedance during the initial rise of the input pulse until the power of the input pulse reaches an arcing threshold of said spark gap causing said spark gap to arc, resulting in an output pulse delivered to said load that has a rise time that is faster than the rise time of the input pulse.

12. The apparatus of claim 11 further comprising:
means for introducing electrons into the spark gap so that consistent arcing of the spark gap is achieved when the arcing threshold is reached.

13. The apparatus of claim 11 further comprising:
- a first coaxial transmission line having a first end connected in shunt to a first side wall of said waveguide section and an adjustable shorted end, said first coaxial transmission line having a center conductor that is tapered to form a substantially conical tip; and
- a second coaxial transmission line having a first end connected in shunt to a second side wall of said waveguide section diametrically opposing said first end of said first coaxial transmission line and an adjustable shorted end, said second coaxial transmission line having a center conductor that is tapered to form a substantially conical tip, said center conductors of said coaxial transmission lines in axial alignment and separated from one another, creating said spark gap.

14. The apparatus of claim 11 further comprising:
means for adjusting the internal pressure of said waveguide section so that the arcing threshold of the spark gap can be varied.

15. An apparatus for producing high power microwave pulses that have extremely fast rise times compared to rise times of a signal delivered from a microwave signal source comprising:
- a coaxial transmission line having a predetermined internal pressure;
- a first center conductor in said coaxial transmission line having a first end tapered to form a substantially conical tip having an apex angle ranging from about 10°–112° and a second end;
- a second center conductor in said coaxial transmission line having a first end tapered to form a substantially conical tip having an apex angle ranging from about 10°–112° and a second end;
- the first end of said first center conductor separated from the first end of said second center conductor creating a spark gap ranging from about 0.01–0.10 inch;
- means for adjusting the internal pressure of said coaxial transmission line so that an arcing threshold of the spark gap can be varied;
- means for providing a bias voltage across the spark gap so that the arcing threshold of the spark gap can be varied;
- means for injecting a gas into said coaxial transmission line so that arcing of the spark gap is promoted when the arcing threshold of said spark gap is reached;
- means for introducing electrons into the spark gap so that consistent arcing of the spark gap is achieved when the arching threshold is reached;
- means for coupling a load to the second end of said second center conductor; and
- means for coupling said microwave signal source to the second end of said first center conductor.

16. The apparatus of claim 15 wherein said means for introducing electrons into said spark gap comprises:
a coaxial line having one end positioned adjacent to the spark gap of said coaxial transmission line and another end connected to a dc power supply.

17. The apparatus of claim 15 wherein said means for adjusting the internal pressure of said coaxial transmission line comprises:
an air line having one end connected to said air coaxial transmission line and another end connected to a vacuum pump.

18. The apparatus of claim 15 wherein said means for providing a bias voltage across said spark gap comprises:
- a first inductor having one end electrically connected to said first center conductor and another end electrically connected to a dc power supply; and
- a second inductor having one end electrically connected to said second center conductor and another end electrically connected to ground.

19. The apparatus of claim 15 wherein said means for injecting a gas into said coaxial transmission line comprises:
an air line having one end connected to said air coaxial transmission line and another end connected to a pressurized gas supply.

20. The apparatus of claim 15 wherein said gas is comprised of helium.

21. An apparatus for producing high power microwave pulses that have extremely fast rise times compared to rise times of a signal delivered from a microwave signal source comprising:

a waveguide section having first and second ends and a predetermined internal pressure;

means for coupling a microwave signal source to the first end of said waveguide section, said microwave signal source generating an electric field in said waveguide at a wavelength lambda;

means for coupling a load to the second end of said waveguide section;

a first coaxial transmission line having a first end connected in shunt to a first side wall of said waveguide section and a shorted end, said first coaxial transmission line having an adjustably positionable center conductor that is tapered to form a substantially conical tip;

a second coaxial transmission line having a first end connected in shunt to a second side wall of said waveguide section diametrically opposing said first end of said first coaxial transmission line and a shorted end, said second coaxial transmission line having an adjustably positionable center conductor that is tapered to form a substantially conical tip, said center conductors of said coaxial transmission lines in axial alignment and separated from one another creating a spark gap ranging from about 0.01–0.10 inch.

22. The apparatus of claim 21 wherein said spark gap is about 0.035 inches.

23. The apparatus of claim 21 further comprising:
first means for controlling the length of said first coaxial transmission line by adjustably positioning the shorted end of said first coaxial transmission line.

24. The apparatus of claim 21 further comprising:
second means for controlling the length of said second coaxial transmission line by adjustably positioning the shorted end of said second coaxial transmission line.

25. The apparatus of claim 21 further comprising:
means for adjusting the internal pressure of said waveguide section so that an arcing threshold of the spark gap can be varied.

26. The apparatus of claim 21 further comprising:
means for introducing electrons into the spark gap so that consistent arcing of the spark gap is achieved when an arcing threshold is reached.

27. The apparatus of claim 21 wherein said first and second center conductors are comprised of tungsten.

28. The apparatus of claim 21 wherein said first and second center conductors are comprised of nickel.

* * * * *